United States Patent
Kong et al.

(10) Patent No.: US 12,463,641 B2
(45) Date of Patent: Nov. 4, 2025

(54) SYNCHRONOUS TRIGGERING SYSTEM, QUANTUM CONTROL SYSTEM AND QUANTUM COMPUTER

(71) Applicant: Origin Quantum Computing Technology (Hefei) Co., Ltd., Anhui (CN)

(72) Inventors: Weicheng Kong, Anhui (CN); Yongjie Zhao, Anhui (CN); Xuebai Li, Anhui (CN); Liangchen Fan, Anhui (CN)

(73) Assignee: Origin Quantum Computing Technology (Hefei) Co., Ltd., Hefei (CN)

( * ) Notice: Subject to any disclaimer, the term of this patent is extended or adjusted under 35 U.S.C. 154(b) by 0 days.

(21) Appl. No.: 18/718,668

(22) PCT Filed: Oct. 27, 2022

(86) PCT No.: PCT/CN2022/127936
§ 371 (c)(1),
(2) Date: Jun. 11, 2024

(87) PCT Pub. No.: WO2023/116190
PCT Pub. Date: Jun. 29, 2023

(65) Prior Publication Data
US 2025/0047281 A1  Feb. 6, 2025

(30) Foreign Application Priority Data

Dec. 23, 2021 (CN) .......................... 202111587715.8
Dec. 23, 2021 (CN) .......................... 202111587945.4
Dec. 23, 2021 (CN) .......................... 202111588000.4

(51) Int. Cl.
H03K 17/92  (2006.01)
H03K 19/20  (2006.01)

(52) U.S. Cl.
CPC ............. *H03K 17/92* (2013.01); *H03K 19/20* (2013.01)

(58) Field of Classification Search
CPC .................................................... H03K 17/92
USPC ............................................................ 327/527
See application file for complete search history.

(56) References Cited

U.S. PATENT DOCUMENTS

2023/0034075 A1* 2/2023 Griffin .................. G06N 10/00

* cited by examiner

*Primary Examiner* — Tomi Skibinski
(74) *Attorney, Agent, or Firm* — Baker Botts LLP

(57) ABSTRACT

Disclosed are a synchronous triggering system, a quantum control system and a quantum computer. The synchronous triggering system comprises a central control device, several routing boards and several functional boards. It guarantees the synchronous triggering of the triggering signals by means of a three-stage triggering synchronization system. In the first stage, the central control device provides several sets of triggering signals to corresponding routing boards, and adjusts an initial time point for each set of triggering signals to output so that each chassis receives the triggering signals concurrently. In the second stage, communication lines from each routing board to the several functional boards are of equal length. In the third stage, the triggering signals arrive at several data-processing devices simultaneously after being processed under the AND-operation of an AND-gate chip.

20 Claims, 4 Drawing Sheets

SYNCHRONOUS TRIGGERING SYSTEM, QUANTUM CONTROL SYSTEM AND QUANTUM COMPUTER

CROSS-REFERENCE TO RELATED APPLICATIONS

The present disclosure is a National Stage of International Application No. PCT/CN2022/127936, filed on Oct. 27, 2022, which claims priority to a Chinese patent application No. 202111587945.4 filed with the CNIPA on Dec. 23, 2021 and entitled "SYNCHRONOUS TRIGGERING SYSTEM AND METHOD, AND QUANTUM CONTROL SYSTEM". The present disclosure claims priority to a Chinese patent application No. 202111587715.8 filed with the CNIPA on Dec. 23, 2021 and entitled "FUNCTIONAL BOARD AND BACKPLANE FOR QUBIT CONTROL, AND QUANTUM CONTROL SYSTEM". The present disclosure claims priority to a Chinese patent application No. 202111588000.4 filed with the CNIPA on Dec. 23, 2021 and entitled "TRIGGERING SYNCHRONIZATION CALIBRATION METHOD FOR QUANTUM CONTROL SYSTEM AND TRIGGERING SYNCHRONIZATION SYSTEM". The above four applications are hereby incorporated by reference in their entireties.

TECHNICAL FIELD

The present disclosure relates to the field of quantum measurement and control, and particularly to a synchronous triggering system and method, a quantum control system and a quantum computer.

BACKGROUND

A quantum chip is a core component for executing quantum computing, and is integrated with multiple qubits therein. In order to guarantee normal operation of qubits, it is necessary to build a special quantum control system in which a plurality of signal modules are arranged for providing various control signals for each qubit, such as frequency control signals, quantum state control signals. In addition, an acquiring module is also needed to acquire the results of the qubits after executing of quantum computing. With the development of technology, the number of qubits on quantum chips has increased to hundreds, or even tens of thousands, accordingly, the number of functional modules in the quantum control system will increase, and the signal wiring will become more and more complex. During execution of quantum computing tasks on a quantum chip, for several qubits executing the same quantum computing task, it is difficult to guarantee that triggers are completely synchronous when the qubits are manipulated, measured and read by multiple functional modules, which greatly reduces the accuracy of the task results.

Therefore, how to realize the synchronous triggering of the manipulation, measurement and reading operation on each qubit is a technical problem in this field that demands urgent solution.

On the basis of the current quantum chip structure, an existing functional board for qubit control is generally to provide a data-processing device to control several functional devices, such as a data-processing device connected to several Analog Digital Converter (ADC) or Digital Analog Convert (DAC). However, with the development of technology, the number of qubits on quantum chips has increased to hundreds, or even tens of thousands, accordingly, the number of functional boards for qubit control in the quantum control system will also increase, and the signal wiring will become more and more complex. For the functional boards for single qubit control, more and more signals are needed to manipulate, measure and read qubits, which signals need to be generated by the functional boards for qubit control, causing data throughput thereof to increase exponentially, which in turn require a huge number of channels. As such, the existing structure where one data-processing device controlling several functional devices cannot meet the demands of large-scale quantum chips.

Therefore, how to make the functional board for qubit control meet the demands of large-scale quantum chips is a technical problem to be solved in this field.

It should be noted that the information disclosed in the background of the present disclosure is only intended to deepen the understanding of the general background of the present disclosure and should not be regarded as conceding or yielding in any form that the information constitutes prior art that is already known to those skilled in the art.

SUMMARY

The present disclosure is directed to provide a synchronous triggering system and method, and a quantum control system and a quantum computer intended for realizing the synchronous triggering of the manipulation, measurement and reading operation on each qubit.

To achieve the above objective, the present disclosure provides a synchronous triggering system for a quantum control system, comprising:
   a central control device connected to several routing boards, configured for providing several sets of triggering signals to corresponding routing boards, and adjusting an initial time point for each set of triggering signals to output so that each chassis receive the triggering signals at the same time point:
   several routing boards, each connected to several functional boards, communication lines from each routing board to the several functional boards to which it is connected being of equal length, the routing boards being configured for forwarding the triggering signals to the functional boards:
   several functional boards, each having an AND-gate chip and several data-processing devices, the triggering signals arriving at the several data-processing devices simultaneously after being processed under an AND-operation of the AND-gate chip, so as to trigger the data-processing devices synchronously.

Optionally, the synchronous triggering system further comprises:
   a reference clock configured for providing a reference clock signal for the central control device and the routing boards.

Optionally, the reference clock is further configured for providing a reference clock signal for the functional boards.

Optionally, there are provided at least two central control devices, and the at least two central control device s work based on a reference clock signal of the same reference clock.

Optionally, the routing boards are configured for outputting feedback signals to the central control device based on the triggering signals:
   the central control device is further configured for obtaining a first time-set, wherein the first time-set is a set of times consumed respectively from outputting the triggering signals by the central control device to receiving the feedback signals by the central control device from individual routing boards;

the central control device is further configured for when individual elements in the first time-set are not all equal, calibrating an initial time point at which the central control device sends the triggering signals to the individual routing boards based on the first time-set.

Optionally, each of the routing boards and the several functional boards to which it is connected are provided inside the same chassis, the routing board is provided in the middle of the chassis, and the several functional boards are provided on both sides of the routing board.

Optionally, the functional board further comprises a board body, wherein the AND-gate chip and the several data-processing devices are provided on the board body.

Optionally, the AND-gate chip has several input terminals for receiving triggering signals, an output terminal of the AND-gate chip is in communication connection with an input terminal of the several data-processing devices, and the AND-gate chip is configured for enabling the triggering signals to arrive at the several data-processing devices simultaneously.

Optionally, the several data-processing devices are provided on the board body at intervals.

Optionally, each of the data-processing devices is in communication connection to several functional devices, and the functional devices are configured for executing, according to instructions of the data-processing devices, corresponding actions.

Optionally, the several functional devices are provided on the board body.

Optionally, the functional board further comprises a communication interface which is provided on the board body and is connected to the data-processing devices.

Optionally, the board body comprises a PCB, on which the data-processing devices, the AND-gate chip and the functional devices are provided.

Optionally, the AND-gate chip is connected to the functional devices through wiring in a top signal layer of the PCB.

Optionally, the AND-gate chip is connected to the data-processing devices through wiring in a top signal layer of the PCB.

Optionally, the data-processing devices are equal in number to input terminals of the AND-gate chip.

Optionally, each of the data-processing devices is connected to the several functional devices.

Optionally, the AND-gate chip is provided between two adjacent data-processing devices on the board body.

Optionally, the functional devices comprise an ADC or a DAC.

Optionally, the data-processing devices comprise an FPGA or an MCU or an MPU or a DSP.

Based on the same concept, the present disclosure further provides a synchronous triggering method of a quantum control system, comprising:

a central control device providing several sets of triggering signals to corresponding routing boards, and adjusting an initial time point for each set of triggering signals to output so that each chassis receive the triggering signals at the same time point, wherein the central control device is connected to several routing boards;

the routing boards forwarding the triggering signals to an AND-gate chip of functional boards, wherein each of the routing boards is connected to the several functional boards, and communication lines from each routing board to the several functional boards to which it is connected are of equal length; and the triggering signals arriving at several data-processing devices simultaneously after being processed under the AND-operation of the AND-gate chip, so as to trigger the data-processing devices synchronously, wherein the functional boards have the AND-gate chip and the several data-processing devices.

Optionally, said "a central control device providing several sets of triggering signals to corresponding routing boards, and adjusting an initial time point for each set of triggering signals to output so that each chassis receive the triggering signals at the same time point" comprises:

outputting a triggering signal to a plurality of routing devices by a control device based on a reference clock signal according to a pre-set initial time point, wherein the reference clock signal is provided by a reference clock;

outputting feedback signals respectively based on the reference clock signal and the triggering signal by the plurality of routing devices;

obtaining a first time-set, wherein the first time-set is a set of times consumed respectively from outputting the triggering signals by the control device to receiving the feedback signals by the control device from individual routing devices; and when individual elements in the first time-set are not all equal, calibrating an initial time point at which the control device sends the triggering signals to the individual routing devices based on the first time-set.

Optionally, said "outputting feedback signals respectively based on the reference clock signal and the triggering signal by the plurality of routing devices" comprises:

the plurality of routing devices receiving the triggering signal and respectively outputting the feedback signals based on the reference clock signal after waiting for a second time. Optionally, the second time is a clock period of several reference clocks.

Optionally, based on a calibrated initial time point, returning to perform said "outputting a triggering signal to a plurality of routing devices by a control device based on a reference clock signal according to a pre-set initial time point" until individual elements in the first time-set are all equal.

Optionally, said "calibrating an initial time point at which the control device sends the triggering signals to the individual routing devices based on the first time-set" comprises:

obtaining a third time set based on the first time-set, wherein the third time set is a set of times consumed separately from outputting the triggering signals by the control device to receiving the triggering signals by the individual routing devices;

obtaining the longest time in the third time set as a fourth time; and adjusting the initial time point at which the control device sends the triggering signals to the individual routing devices based on the fourth time.

Optionally, the routing device corresponding to the fourth time is a first routing device; said "adjusting the initial time point at which the control device sends the triggering signals to the individual routing devices based on the fourth time" comprises:

performing a sending-delayed processing on an initial time point at which the control device outputs the triggering signals to all routing devices in the plurality of routing devices except the first routing device such that the triggering signals output by the control device arrive at individual routing devices at the same time point.

Optionally, said "calibrating an initial time point at which the control device sends the triggering signals to the individual routing devices based on the first time-set" comprises:

obtaining a third time set based on the first time-set, wherein the third time set is a set of times consumed separately from outputting the triggering signals by the control device to receiving the triggering signals by the individual routing devices;

obtaining the shortest time in the third time set as a fifth time; and adjusting the initial time point at which the control device sends the triggering signals to the individual routing devices based on the fifth time.

Optionally, the routing device corresponding to the fifth time is a second routing device; said "adjusting the initial time point at which the control device sends the triggering signals to the individual routing devices based on the fifth time" comprises:

performing a sending-ahead processing on an initial time point at which the control device outputs the triggering signals to all routing devices in the plurality of routing devices except the second routing device such that the triggering signals output by the control device arrive at individual routing devices at the same time point.

Optionally, said "calibrating an initial time point at which the control device sends the triggering signals to the individual routing devices based on the first time-set" comprises:

obtaining a third time set based on the first time-set, wherein the third time set is a set of times consumed separately from outputting the triggering signals by the control device to receiving the triggering signals by the individual routing devices;

obtaining the time corresponding to a selected third routing device in the third time set as a sixth time; and adjusting the initial time point at which the control device sends the triggering signals to the individual routing devices based on the sixth time.

Optionally, said "adjusting the initial time point at which the control device sends the triggering signals to the individual routing devices based on the sixth time" comprises:

performing a sending-delayed processing or a sending-ahead processing on an initial time point at which the control device outputs the triggering signals to all routing devices in the plurality of routing devices except the third routing device such that the triggering signals output by the control device arrive at individual routing devices at the same time point.

Optionally, the individual elements in the third time set are obtained by the following formula:

$$t = T/2;$$

wherein, t is the time consumed from outputting the triggering signals by the control device to receiving the triggering signals by one of the routing devices, and T is determined according to the elements in the first time-set.

Based on the same concept, the present disclosure further provides a quantum control system, which uses the synchronous triggering system of the quantum control system described above, or comprises the synchronous triggering method of the quantum control system described above.

Based on the same concept, the present disclosure further provides a quantum computer comprising the quantum control system described above.

Compared to prior art, the present disclosure has the following beneficial effects:

The synchronous triggering system proposed by the present disclosure comprises the central control device, the several routing boards and the several functional boards, which guarantees the synchronous triggering of the triggering signals by means of a three-stage triggering synchronization system, wherein the first stage is that a central control device providing several sets of triggering signals to corresponding routing boards, and adjusting an initial time point for each set of triggering signals to output so that each chassis receive the triggering signals at the same time point; the second stage is that communication lines from each routing board to the several functional boards to which it is connected are of equal length; and the third stage is that the triggering signals arriving at several data-processing devices simultaneously after being processed under the AND-operation of the AND-gate chip, so as to trigger the data-processing devices synchronously.

Based on the above structure, by connecting the AND-gate chip to the plurality of data-processing devices, it is possible to meet the demands of large-scale quantum chips, and since it is necessary to guarantee that the triggering of the plurality of data-processing devices in the functional board for single qubit control is completely synchronous, the structure of the AND-gate chip may also guarantee that the plurality of triggering signals arrive at a corresponding data-processing device simultaneously, and in turn realize the synchronization of the corresponding operations of qubit control. As set forth in the present disclosure, the backplane, VPX chassis and the quantum control system as well as the functional board for qubit control belong to the same concept, and thus have the same beneficial effects, which are not repeated herein.

Based on the above calibration methods, it is possible to effectively realize the triggering synchronization of the quantum control system. Besides, by providing the reference clock signal to the control device and routing device with the same reference clock, it is possible to make individual devices in the quantum control system perform related actions in the same timing sequence, which further guarantees the accuracy of the calibration method and reduces the difficulty of triggering synchronization calibration of the quantum control system. The synchronous triggering system of the quantum control system, the quantum control system and the readable storage medium proposed by the present disclosure belong to the same concept as the synchronous triggering calibration method, and thus have the same beneficial effects, which are not further elaborated herein.

Figure 1:
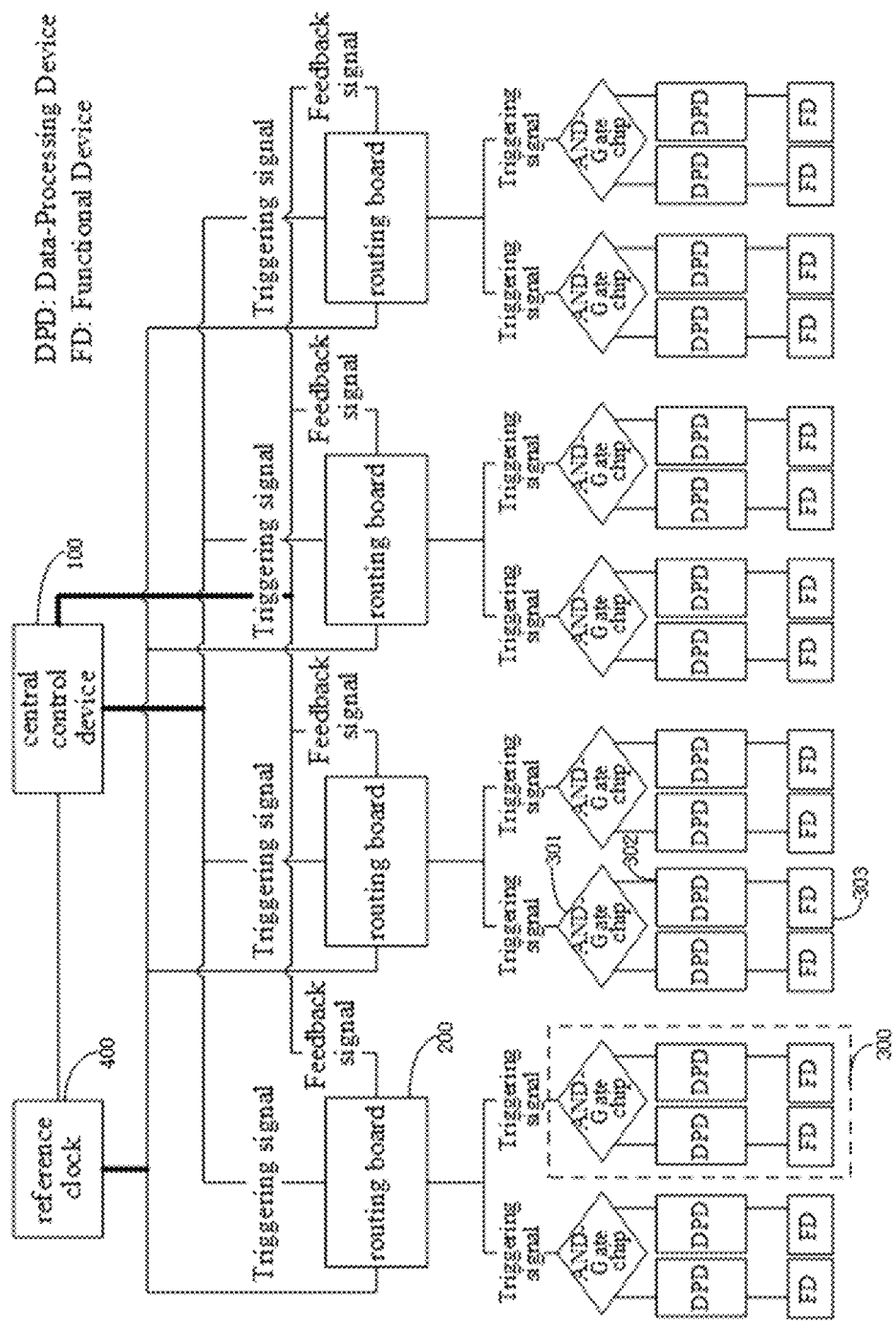
FIG. 1 is a schematic structural illustration of a synchronous triggering system according to an embodiment of the present disclosure.

Reference Signs: 100—central control device, 200—routing board, 300—functional board, 301—AND-gate chip, 302—data-processing device, 303—functional device, 400—reference clock, 1100—board body, 2100—AND-gate chip, 3100—data-processing device, 4100—functional device.

DETAILED DESCRIPTION

Embodiments of the present disclosure will be described in more detail below with reference to schematic diagrams. Advantages and features of the present disclosure will become apparent from the following description and claims. It should be noted that the drawings are in very simplified form and are not to precise scale for convenience and clarity only as an aid to explaining the embodiments of the present disclosure.

In the description of the present application, it should be understood that, an orientation or positional relationship indicated by terms "central", "upper", "lower", "left", "right", and the like is based on the orientation or positional relationship shown in the accompanying drawings, and is only for convenience of describing the present application and simplifying the description, rather than indicating or implying that a device or element referred to must be provided with a particular orientation, be constructed and operate in a particular orientation, and therefore should not be understood as a limitation to the present application.

In addition, terms "first" and "second" are only used for descriptive purposes and should not be understood as indicating or implying relative importance or implying a number of indicated technical features. Therefore, a feature delimited with "first", "second" may expressly or implicitly comprise at least one of those features. In a description of the present application, "a plurality" means at least two, such as two, three, etc., unless expressly and specifically defined otherwise.

For some quantum computers currently available on the market, most adopt a combination of a host computer, a quantum control system, and a quantum chip to perform certain quantum computing tasks. Generally, the host computer receives the user's quantum computing tasks to process them and form a quantum circuit, and the quantum circuit is then mapped to the topological structure of the corresponding quantum chip. The quantum circuit comprises the quantum logic gates required for this quantum computing task, the measurement operation for the final quantum computing result, and the timing of each operation. When the quantum control system receives the information contained in the quantum circuit, it converts the information into corresponding instructions so that the appropriate hardware devices may operate and complete the quantum computing task.

Typically, a quantum chip is provided with multiple qubits (also known as qubits) and data transmission lines. Each qubit comprises a detector and a qubit device that are mutually coupled, wherein the qubit device may be an artificial superconducting qubit made up of a superconducting Josephson junction and ground capacitance, and the detector may be a resonant cavity. The qubit device is provided with a first control signal line and a second control signal line, and the detector coupled with the qubit device is provided with a third control signal line, wherein the first control signal line is configured for transmitting a quantum state regulating signal for regulating the quantum state information of the qubit device. The second control signal line is configured for transmitting a frequency regulating signal for regulating a frequency parameter of the qubit device, and the third control signal line is configured both for transmitting a measurement signal for measuring and reading the detector and for outputting a read-back signal returned by the detector, thereby enabling indirect reading and measurement of the state of the qubit device. Therefore, the quantum control system configured for the regulation and measurement of qubits in the quantum chip needs to generate and output three types of control signals to be provided to the first to third control signal lines, respectively, thereby allowing for the regulation and measurement of the qubits within the quantum chip.

The applicant has found in a practical application that since the quantum logic gates included in the quantum computing tasks need to be completed before decoherence of the corresponding qubit, there is a high demand for the precision of the control signals when the quantum chip processes the quantum computing task. When executing quantum computing tasks, it is often necessary to regulate or read multiple qubits simultaneously, at which point it is necessary to ensure that the signals output by the quantum control system to multiple qubits may be synchronously triggered.

Based on the aforementioned findings, in order to ensure that the signals sent to multiple qubits are synchronously triggered, an embodiment of the present disclosure provides a synchronous triggering system, which, please refer to FIG. 1, comprises: a central control device 100 connected to several routing boards 200, configured for providing several sets of triggering signals to corresponding routing boards 200, and adjusting an initial time point for each set of triggering signals to output so that each chassis receive the triggering signals at the same time point; several routing boards 200, each connected to several functional boards 300, communication lines from each routing board 200 to the several functional boards 300 to which it is connected being of equal length, the routing boards 200 being configured for forwarding the triggering signals to the functional boards 300; and several functional boards 300, each having an AND-gate chip 301 and several data-processing devices 302, the triggering signals arriving at the several data-processing devices 302 simultaneously after being processed under an AND-operation of the AND-gate chip 301, so as to trigger the data-processing devices 302 synchronously.

The difference from the prior art lies in that the synchronous triggering system proposed in the present embodiment comprises the central control device 100, the several routing boards 200, and the several functional boards 300, and ensures the synchronous triggering of the trigger signals through a three-level synchronous triggering system, wherein the first lever is that the central control device 100 provides the several sets of triggering signals to the corresponding routing boards 200, and adjusts the initial time point for each set of triggering signals to output so that each chassis receive the triggering signals at the same time point: the second-level is that the communication lines from each routing board 200 to the several functional boards 300 to which it is connected are of equal length; and the third-level is that the triggering signals arrive at the several data-processing devices 302 simultaneously after being processed under the AND-operation of the AND-gate chip 301, so as to trigger the data-processing devices 302 synchronously.

Further referring to FIG. 1, since the hardware devices need to operate in a certain sequence, in order to make the hardware devices in the synchronous triggering system work under the same clock, the synchronous triggering system also comprises a reference clock 400, which is configured for providing a reference clock 400 signal to the central control device 100 and the routing boards 200, and is also configured for providing a reference clock 400 signal to the functional board 300.

It should be noted that the reference clock 400 proposed in the present embodiment may be an atomic clock, which is a highly accurate timekeeper and comes in various types, such as cesium atomic clocks, hydrogen atomic clocks, rubidium atomic clocks, CPT atomic clocks, etc. In the present embodiment, the reference clock 400 is preferably a rubidium atomic clock, and in other embodiments, may also be selected from other types of atomic clocks, which is not restricted herein but is selected based on actual needs. Additionally, the data-processing device 302 is a device with data forwarding and processing capabilities, which may generally be selected from FPGA (Field Programmable Gate Array), MCU (Microcontroller Unit), MPU (Microprocessor Unit), or DSP (Digital Signal Processor), etc. In the present embodiment, the data-processing device 302 is preferably the FPGA, and in other embodiments, may also be selected from other devices with similar data-processing capability, which is not restricted herein. The central control device 100 is an intelligent device with data-processing capability and may, for example, be the FPGA, MCU, MPU, or DSP, etc. In the present embodiment, the central control device 100 is preferably the FPGA.

Figure 2:
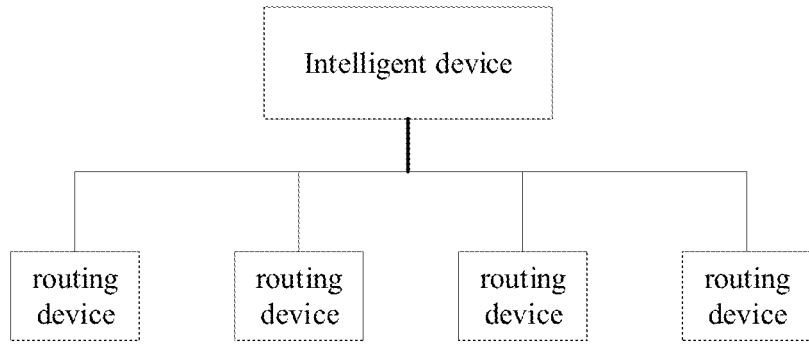
FIG. 2 is a schematic structural illustration of a central control device in FIG. 1.

It is understandable to those skilled in the art that interfaces provided by any hardware device are always limited. It is foreseeable that in the future, once large-scale or ultra-large-scale quantum chips are successfully developed, the number of qubits that need to be controlled will also increase exponentially. At this point, the synchronous triggering system needs to ensure the synchronous triggering of a large number of qubits. The synchronous triggering system proposed in the present disclosure may meet the demands of the large-scale quantum chips to a certain extent, and what is required is merely to expand according to the above structure, which specifically may involve increasing the number of the central control devices 100, with all central control devices 100 operating based on the reference clock 400 signal from the same reference clock 400. Of course, since the number of channels of the reference clock 400 is also limited, when the channels of a single reference clock 400 are insufficient, multiple reference clocks 400 may be used to jointly provide the reference clock 400 signal. One of the reference clocks 400 acts as a master clock, and all other reference clocks 400 act as slave clocks. The master clock is configured for providing the reference clock 400 to all slave clocks, and the slave clocks are configured for providing the reference clock 400 signal to the hardware in the synchronous triggering system. The above may be understood as the horizontal expansion of the synchronous triggering system proposed in the present disclosure. Additionally, the synchronous triggering system proposed in the present disclosure may also be expanded vertically. Specifically, in the present embodiment, the central control device may be an intelligent device with data-processing capability. When addressing the scenario of synchronous triggering of a large number of qubits, the central control device may also be constructed by connecting several routing devices with the intelligent device with data-processing capability. Please refer to FIG. 2, the routing device is connected to several routing boards, which structure may also meet the demand for the synchronous triggering of a large number of qubits. It should be noted that the above is merely an exemplary illustration, and there are many other similar options in addition to the above option, which are not elaborated one by one herein and may be selected according to actual needs for dealing with the large-scale quantum chips.

Furthermore, in the first-level of synchronization of the synchronous triggering system, the central control device 100 calibrates the initial time point for sending the trigger signals to the routing boards 200. Specifically, the routing boards 200 are configured for outputting feedback signals to the central control device 100 based on the triggering signals. The central control device 100 is further configured for obtaining a first time-set, wherein the first time-set is a set of times consumed respectively from outputting the triggering signals by the central control device 100 to receiving the feedback signals by the central control device 100 from individual routing boards 200. The central control device 100 is further configured for when individual elements in the first time-set are not all equal, calibrating an initial time point at which the central control device 100 sends the triggering signals to the individual routing boards 200 based on the first time-set.

In the synchronous triggering system proposed in the present embodiment, the central control device 100 outputs the trigger signals to the plurality of routing boards 200 based on the reference clock 400 signal provided by the reference clock 400: the plurality of routing devices output the feedback signals respectively based on the reference clock 400 signal and the triggering signal, and obtain a first time-set: when individual elements in the first time-set are not all equal, calibrating an initial time point at which the control device 100 sends the triggering signals to the individual routing devices 200 based on the first time-set. Based on the above calibration process, the synchronous triggering may be effectively achieved. Additionally, by providing the reference clock 400 signal from the same reference clock 400 to both the central control device 100 and the routing boards 200, it is possible to ensure that each device in the quantum control system performs its actions in the same timing, thereby further ensuring the accuracy of the calibration process and simultaneously reducing the difficulty of the synchronous triggering of the quantum control system.

All routing boards 200 synchronize their actions based on the reference clock 400 signal provided by the reference clock 400. If the routing boards 200 return and output the feedback signal immediately upon receiving the trigger signal, it is highly likely to cause a disorder in the clock timing. Since the routing boards 200 operate in a certain timing, it needs to first expend some time to process the received information at the time point of receiving the trigger signal. For example, assuming that the routing boards 200 is set to trigger work on the rising edge of the clock timing, and if the current routing boards 200 receives the trigger signal on the falling edge of the clock timing, and if the signal is directly returned at this moment, then the signals returned to the central control device 100 is bound to be erroneous since the routing boards 200 do not actually receive the trigger signal, which ultimately leads to an imprecise calibration of the synchronous triggering for the quantum control system. The applicant has considered to let all the routing boards 200 wait for a certain clock period after receiving the trigger signal, and then return the feedback signal, so that the above problem may be effectively solved.

Based on the above concept, the plurality of routing devices 200 output the feedback signals respectively based on the reference clock 400 signal and the triggering signal, receive the triggering signal, and respectively output the feedback signals based on the reference clock 400 signal after waiting for a second time.

In the present embodiment, the second time may be a clock period of several reference clocks 400.

Since the precision of the synchronous triggering that may be achieved through a single calibration process may not meet the requirements on the quantum computing, in order to improve the accuracy of the synchronous triggering, the applicant proposes the following scheme: based on a calibrated initial time point, returning to perform said "outputting a triggering signal to a plurality of routing devices 200 by a control device 100 based on a reference clock 400 signal according to a pre-set initial time point" until individual elements in the first time-set are all equal.

The scheme of calibrating an initial time point at which the control device 100 sends the triggering signals to the individual routing devices 200 by means of the first time-set may be selected according to actual needs. In the present embodiment, three preferred schemes are provided for selection, and are preferred implementation schemes. Other schemes may also be chosen in actual application, which are not elaborated one by one here. The following specifically describes these three preferred schemes:

The first scheme is:
obtaining a third time set based on the first time-set, wherein the third time set is a set of times consumed separately from outputting the triggering signals by the control device 100 to receiving the triggering signals by the individual routing devices 200;
obtaining the longest time in the third time set as a fourth time; and
adjusting the initial time point at which the control device 100 sends the triggering signals to the individual routing devices 200 based on the fourth time.

Specifically, the routing device 200 corresponding to the fourth time is a first routing device 200: said "adjusting the initial time point at which the control device 100 sends the triggering signals to the individual routing devices 200 based on the fourth time" may comprise:
performing a sending-delayed processing on an initial time point at which the control device 100 outputs the triggering signals to all routing devices 200 in the plurality of routing devices 200 except the first routing device 200 such that the triggering signals output by the control device 100 arrive at individual routing devices 200 at the same time point.

The second scheme is:
obtaining a third time set based on the first time-set, wherein the third time set is a set of times consumed separately from outputting the triggering signals by the control device 100 to receiving the triggering signals by the individual routing devices 200;
obtaining the shortest time in the third time set as a fifth time; and
adjusting the initial time point at which the control device 100 sends the triggering signals to the individual routing devices 200 based on the fifth time.

Specifically, the routing device 200 corresponding to the fifth time is a second routing device 200; said "adjusting the initial time point at which the control device 100 sends the triggering signals to the individual routing devices 200 based on the fifth time" may comprise:
performing a sending-ahead processing on an initial time point at which the control device 100 outputs the triggering signals to all routing devices 200 in the plurality of routing devices 200 except the second routing device 200 such that the triggering signals output by the control device 100 arrive at individual routing devices 200 at the same time point.

The third scheme is:
obtaining a third time set based on the first time-set, wherein the third time set is a set of times consumed separately from outputting the triggering signals by the control device 100 to receiving the triggering signals by the individual routing devices 200;
obtaining the time corresponding to a selected third routing device 200 in the third time set as a sixth time; and
adjusting the initial time point at which the control device 100 sends the triggering signals to the individual routing devices 200 based on the sixth time.

Specifically, said "adjusting the initial time point at which the control device 100 sends the triggering signals to the individual routing devices 200 based on the sixth time" may comprise:
performing a sending-delayed processing or a sending-ahead processing on an initial time point at which the control device 100 outputs the triggering signals to all routing devices 200 in the plurality of routing devices 200 except the third routing device 200 such that the triggering signals output by the control device 100 arrive at individual routing devices 200 at the same time point.

In the present embodiment, the individual elements in the third time set are obtained by the following formula:

$$t = T/2;$$

wherein, t is the time consumed from outputting the triggering signals by the control device 100 to receiving the triggering signals by one of the routing devices 200, and T is determined according to the elements in the first time-set. It should be noted that if the plurality of routing boards 200 receive the trigger signals and all wait for the second time, then T=T1−t2, wherein T1 is an element of the first time-set, and t2 is the second time. If the plurality of routing boards 200 receive the trigger signals and do not need to wait for the second time, then T=T1.

It should be understood by those skilled in the art that, in addition to the three schemes described above, there may also be other similar schemes. The choice of which scheme to use in actual application may be adjusted as needed, which is not restricted herein.

Additionally, the trigger signal mentioned in the above three schemes is a signal used during the calibration process, and may also be a signal used in the actual application of the quantum computing. However, to ensure that the calibration accuracy of the synchronous trigger in the quantum control system is sufficiently high, the trigger signal mentioned in the above three schemes may also be a signal that is not used in the actual application of the quantum computing. Specifically, the frequency of the trigger signal is higher than the frequency of the signal used in the actual application of the quantum computing. For example, if the frequency of the signal used in the actual application of the quantum computing is 1 MHz, then the frequency of the trigger signal may be set to 10 MHz.

Further, in the second-level synchronization of the synchronous triggering system, each of the routing boards 200 and the several functional boards 300 to which it is connected are provided inside the same chassis, the routing board 200 is provided in the middle of the chassis, and the several functional boards 300 are provided on both sides of the routing board.

Further, in the third-level synchronization of the synchronous triggering system, the functional board 300 further comprises a board body, wherein the AND-gate chip 301 and the several data-processing devices 302 are provided on the board body.

It should be understood by those skilled in the art that in the present embodiment, the functional device 303 functions to generate various signals required for manipulating, measuring, and reading qubits, and may generally be an ADC or DAC, wherein the ADC is configured for acquiring information from the resonant cavity, and the DAC is configured for generating the quantum state regulating signal for regulating quantum state information or the frequency regulating signal for regulating the frequency parameters. For example, in the actual application, when using the quantum chip for the quantum computing, it is necessary to perform corresponding operations on the corresponding qubits. Assuming there is a need to regulate the quantum state information of qubits, since the precision required for the regulating signals of qubits is very high and sometimes it is necessary to regulate multiple qubits simultaneously, often multiple sets of DACs need to perform corresponding actions simultaneously to generate the corresponding regulating signals, which requires the corresponding trigger signals to simultaneously trigger the corresponding functional devices 303 so that they can generate the required regulating signals and output them to the corresponding qubits in the quantum chip. By means with the functional board 300 proposed in the present embodiment, it is possible to effectively ensure that the trigger signals sent to multiple sets of DACs synchronously trigger their corresponding data-processing devices 302, so as to synchronously trigger the multiple sets of DACs, ultimately improving the precision of the quantum computing run on the quantum chip.

Further, each of the data-processing devices 302 is in communication connection to several functional devices 303, and the functional devices 303 are configured for executing, according to instructions of the data-processing devices 302, corresponding actions. It should be noted that FIG. 1 is only an illustrative representation of the present embodiment and should not be construed as any limitation on the present disclosure. In FIG. 1, each data-processing device 302 is connected to only one functional device 303, and in actual application, each data-processing device 302 may be connected to multiple functional devices 303, which is not restricted herein. In the present embodiment, each data-processing device 302 is preferably connected to four functional devices 303, which may be understood as each FPGA being connected to four ADCs or four DACs in specific applications. It should be understood by those skilled in the art that in other embodiments, each data-processing device 302 may also be connected to other quantities of functional devices 303, which is not restricted herein and may be adjusted according to actual needs.

Furthermore, the AND-gate chip 301 is positioned in close proximity between two adjacent FPGAs, and the output of the high-speed AND-gate chip 301 is connected to the two FPGAs separately with strict equal-length control for the shortest path.

Further referring to FIG. 1, by enabling the AND-gate chip 301 to connect to the multiple data-processing devices 302, it is possible to accommodate the demand of the large-scale quantum chips. Furthermore, since it is necessary to ensure that the triggering of the multiple data-processing devices 302 in a single functional board 300 is completely synchronized, the structure of the AND-gate chip 301 also ensures that the multiple trigger signals arrive simultaneously at the corresponding data-processing device 302.

In the embodiment of the present disclosure, each data-processing device 302 requires a trigger signal. Therefore, to ensure that each data-processing device 302 has a trigger signal, the number of the data-processing devices 302 is equal to the number of input terminals on the AND-gate chip 301.

It should be noted that the data-processing device 302 is a device with data forwarding and processing capabilities, which may generally be selected from FPGA (Field Programmable Gate Array), MCU (Microcontroller Unit), MPU (Microprocessor Unit), or DSP (Digital Signal Processor), etc. In the present embodiment, the data-processing device 302 is preferably the FPGA, and in other embodiments, may also be selected from other devices with similar data-processing capability, which is not restricted herein.

It is to be understood by those skilled in the art that the functional board 300 requires a corresponding functional device 303 to achieve the corresponding function. For example, a device with the analog-to-digital conversion capability is needed to perform analog-to-digital conversion, and a device with the digital-to-analog conversion capability is needed to perform digital-to-analog conversion. The device with the analog-to-digital conversion capability may be implemented by using a pure circuit structure, and may also be implemented by using an AD chip (i.e., ADC). Similarly, the device with the digital-to-analog conversion capability may be implemented using a pure circuit structure, and may also be implemented by using a DA chip (i.e., DAC). In the present embodiment, the functional device 303 is preferably an ADC or DAC.

Additionally, in the present embodiment, the AND-gate chip 301 may be selected according to actual needs and may include, but is not limited to, HMC746, 7408TTL, 7409TTL, 74X11, 74X21, CD4081, CD4082, which is not restricted herein.

Specifically, the board body may be a PCB (Printed Circuit Board), and the data-processing device 302, the AND-gate chip 301, and the functional device 303 are all provided on the PCB board.

In the present embodiment, the AND-gate chip 301 is preferably connected to the functional devices through wiring in a top signal layer of the PCB, and the AND-gate chip 301 is connected to the data-processing devices 302 through wiring in a top signal layer of the PCB. When wiring in a top signal layer is used, one side of the transmission line is the medium, the other side is air, the dielectric constant thereof is lower than that of the middle layer, and the transmission line has a small delay, which characteristic determines that the wiring in a top signal layer may have a faster signal transmission speed. Therefore, the top signal layer may be utilized for routing high-speed signals, such as 2.5 GHZ or 3.125 GHZ. When routing the high-speed signals, it is best to avoid making a hole. If it is indeed necessary to make a hole, the punching is switched from the top layer to the bottom layer or from the bottom layer to the top signal layer, and then there is no via stub effect, which characteristic is also not possessed by the internal layer routing.

It is to be understood by those skilled in the art that in addition to some components listed in the present embodiment, the functional board 300 further comprises some peripheral circuits or devices. For example, the functional board 300 further comprises a communication interface, which is provided on the board body and connected to the data-processing device 302. There are also other devices, which are not enumerated in detail here.

Figure 3:
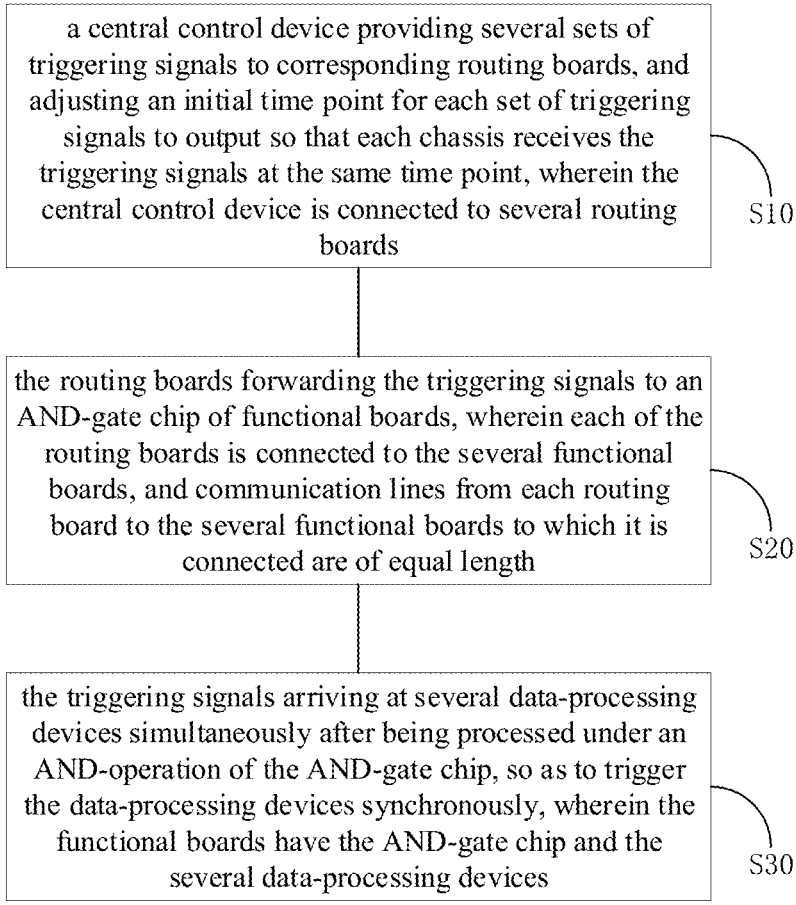
FIG. 3 is a flowchart of a synchronous triggering method according to another embodiment of the present disclosure.

Please refer to FIG. 3, based on the same inventive concept, the embodiment of the present disclosure also proposes a synchronous triggering method, comprising:

- S10: a central control device providing several sets of triggering signals to corresponding routing boards, and adjusting an initial time point for each set of triggering signals to output so that each chassis receives the triggering signals at the same time point, wherein the central control device is connected to several routing boards;
- S20: the routing boards forwarding the triggering signals to an AND-gate chip of functional boards, wherein each of the routing boards is connected to the several functional boards, and communication lines from each routing board to the several functional boards to which it is connected are of equal length; and
- S30: the triggering signals arriving at several data-processing devices simultaneously after being processed under an AND-operation of the AND-gate chip, so as to trigger the data-processing devices synchronously, wherein the functional boards have the AND-gate chip and the several data-processing devices.

Based on the same inventive concept, the embodiment of the present disclosure also proposes a quantum control system, comprising the synchronous triggering system as described in any of the above feature descriptions.

Typically, a quantum chip is provided with multiple qubits (also known as qubits) and data transmission lines. Each qubit comprises a detector and a qubit device that are mutually coupled, wherein the qubit device may be an artificial superconducting qubit made up of a superconducting Josephson junction and ground capacitance, and the detector may be a resonant cavity. The qubit device is provided with a first control signal line and a second control signal line, and the detector coupled with the qubit device is provided with a third control signal line, wherein the first control signal line is configured for transmitting a quantum state regulating signal for regulating the quantum state information of the qubit device. The second control signal line is configured for transmitting a frequency regulating signal for regulating a frequency parameter of the qubit device, and the third control signal line is configured both for transmitting a measurement signal for measuring and reading the detector and for outputting a read-back signal returned by the detector, thereby enabling indirect reading and measurement of the state of the qubit device. Therefore, the quantum control system configured for the regulation and measurement of qubits in the quantum chip needs to generate and output three types of control signals to be provided to the first to third control signal lines, respectively, thereby allowing for the regulation and measurement of the qubits within the quantum chip.

Figure 4:
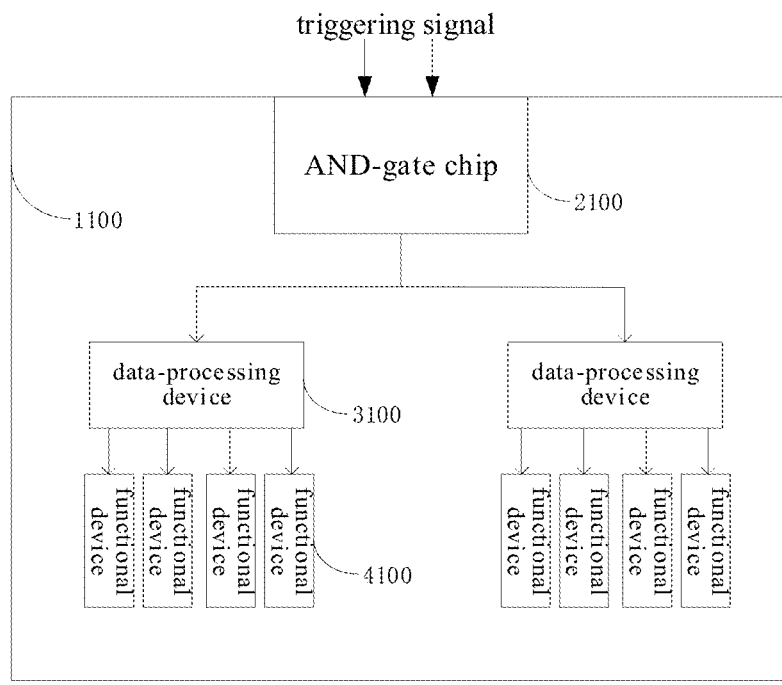
FIG. 4 is a schematic structural illustration of a functional board for qubit control according to an embodiment of the present disclosure.

Please refer to FIG. 4, the embodiment of the present disclosure proposes a functional board for qubits control, comprising a board body 1100, an AND-gate chip 2100, several data-processing devices 3100, and several functional devices 4100. The AND-gate chip 2100 is provided on the board body 1100, the AND-gate chip 2100 has several input terminals for receiving triggering signals, an output terminal of the AND-gate chip 2100 is in communication connection with an input terminal of the several data-processing devices 3100, and the AND-gate chip 2100 is configured for enabling the triggering signals to arrive at the several data-processing devices 3100 simultaneously. The several data-processing devices 3100 are provided on the board body 1100 at intervals, and configured for generating operational instructions based on the trigger signals. The several functional devices 4100 are provided on the board body 1100, are in communication connection to the output terminal of the data-processing devices 3100, and are configured for executing corresponding actions for qubits control based on the operational instructions. It should be understood by those skilled in the art that in the present embodiment, the functional device functions to generate various signals required for manipulating, measuring, and reading qubits, and may generally be an ADC or DAC, wherein the ADC is configured for acquiring information from the resonant cavity, and the DAC is configured for generating the quantum state regulating signal for regulating quantum state information or the frequency regulating signal for regulating the frequency parameters. For example, in the actual application, when using the quantum chip for the quantum computing, it is necessary to perform corresponding operations on the corresponding qubits. Assuming there is a need to regulate the quantum state information of qubits, since the precision required for the regulating signals of qubits is very high and sometimes it is necessary to regulate multiple qubits simultaneously, often multiple sets of DACs need to perform corresponding actions simultaneously to generate the corresponding regulating signals, which requires the corresponding trigger signals to simultaneously trigger the corresponding functional devices so that they can generate the required regulating signals and output them to the corresponding qubits in the quantum chip. By means with the functional board for qubits control proposed in the present embodiment, it is possible to effectively ensure that the trigger signals sent to multiple sets of DACs synchronously trigger their corresponding data-processing devices, so as to synchronously trigger the multiple sets of DACs, ultimately improving the precision of the quantum computing run on the quantum chip.

The difference from the prior art lies in that the embodiment of the present disclosure proposes a functional board for qubits control, comprising a board body 1100, an AND-gate chip 2100, several data-processing devices 3100, and several functional devices 4100. The AND-gate chip 2100 is provided on the board body 1100, the AND-gate chip 2100 has several input terminals for receiving triggering signals, an output terminal of the AND-gate chip 2100 is in communication connection with an input terminal of the several data-processing devices 3100, and the AND-gate chip 2100 is configured for enabling the triggering signals to arrive at the several data-processing devices 3100 simultaneously. The several data-processing devices 3100 are provided on the board body 1100 at intervals, and configured for generating operational instructions based on the trigger signals. The several functional devices 4100 are provided on the board body 1100, are in communication connection to the output terminal of the data-processing devices 3100, and are configured for executing corresponding actions based on the operational instructions. Based on the above structure, by connecting the AND-gate chip 2100 to the plurality of data-processing devices 3100, it is possible to meet the demands of large-scale quantum chips, and since it is necessary to guarantee that the triggering of the plurality of data-processing devices 3100 in the functional board for single qubit control is completely synchronous, the structure of the AND-gate chip 2100 may also guarantee that the plurality of triggering signals arrive at a corresponding data-processing device simultaneously.

In the embodiment of the present disclosure, each data-processing device 3100 requires a trigger signal. Therefore, to ensure that each data-processing device 3100 has a trigger signal, the number of the data-processing device 3100 is equal to the number of input terminals on the AND-gate chip 2100.

It should be noted that the data-processing device 3100 is a device with data forwarding and processing capabilities, which may generally be selected from FPGA (Field Programmable Gate Array), MCU (Microcontroller Unit), MPU (Microprocessor Unit), or DSP (Digital Signal Processor), etc. In the present embodiment, the data-processing device 3100 is preferably the FPGA, and in other embodiments, may also be selected from other devices with similar data-processing capability, which is not restricted herein.

It is to be understood by those skilled in the art that the functional board for qubits control requires a corresponding functional device 4100 to achieve the corresponding function. For example, a device with the analog-to-digital conversion capability is needed to perform analog-to-digital conversion, and a device with the digital-to-analog conversion capability is needed to perform digital-to-analog conversion. The device with the analog-to-digital conversion capability may be implemented by using a pure circuit structure, and may also be implemented by using an AD chip (i.e., ADC). Similarly, the device with the digital-to-analog conversion capability may be implemented using a pure circuit structure, and may also be implemented by using a DA chip (i.e., DAC). In the present embodiment, the functional device 4100 is preferably an ADC or DAC.

Additionally, in the present embodiment, the AND-gate chip 2100 may be selected according to actual needs and may include, but is not limited to, HMC746, 7408TTL, 7409TTL, 74X11, 74X21, CD4081, CD4082, which is not restricted herein.

Optionally, each data-processing device 3100 is connected to several functional devices 4100. Please refer to FIG. 4, in the present embodiment, each data-processing device 3100 is connected to four functional devices 4100, which may be understood as each FPGA being connected to four ADCs or four DACs in specific applications. It should be understood by those skilled in the art that in other embodiments, each data-processing device 3100 may also be connected to other quantities of functional devices 4100, which is not restricted herein and may be adjusted according to actual needs. Furthermore, the AND-gate chip 2100 is positioned in close proximity between two adjacent FPGAs, and the output of the high-speed AND-gate chip 4100 is connected to the two FPGAs separately with strict equal-length control for the shortest path.

Specifically, the board body 1100 may be a PCB (Printed Circuit Board), and the data-processing device 3100, the AND-gate chip 2100, and the functional devices 4100 are all provided on the PCB board.

In the present embodiment, the AND-gate chip 2100 is preferably connected to the functional devices 4100 through wiring in a top signal layer of the PCB, and the AND-gate chip 2100 is connected to the data-processing devices 3100 through wiring in a top signal layer of the PCB. When wiring in a top signal layer is used, one side of the transmission line is the medium, the other side is air, the dielectric constant thereof is lower than that of the middle layer, and the transmission line has a small delay, which characteristic determines that the wiring in a top signal layer may have a faster signal transmission speed. Therefore, the top signal layer may be utilized for routing high-speed signals, such as 2.5 GHz or 3.125 GHZ. When routing the high-speed signals, it is best to avoid making a hole. If it is indeed necessary to make a hole, the punching is switched from the top layer to the bottom layer or from the bottom layer to the top signal layer, and then there is no via stub effect, which characteristic is also not possessed by the internal layer routing.

It is to be understood by those skilled in the art that in addition to some components listed in the present embodiment, the functional board for qubits control further comprises some peripheral circuits or devices. For example, the functional board for qubits control further comprises a communication interface, which is provided on the board body and connected to the data-processing device 3100.

Based on the same inventive concept, the embodiment of the present disclosure also proposes a backplane, comprising the functional board for qubits control as described in any of the above feature descriptions.

Based on the same inventive concept, the embodiment of the present disclosure also proposes a VPX chassis, comprising the backplane as described in the above feature descriptions.

Based on the same inventive concept, the embodiment of the present disclosure also proposes a quantum control system, comprising the functional board for qubits control as described in any of the above feature descriptions.

Figure 5:
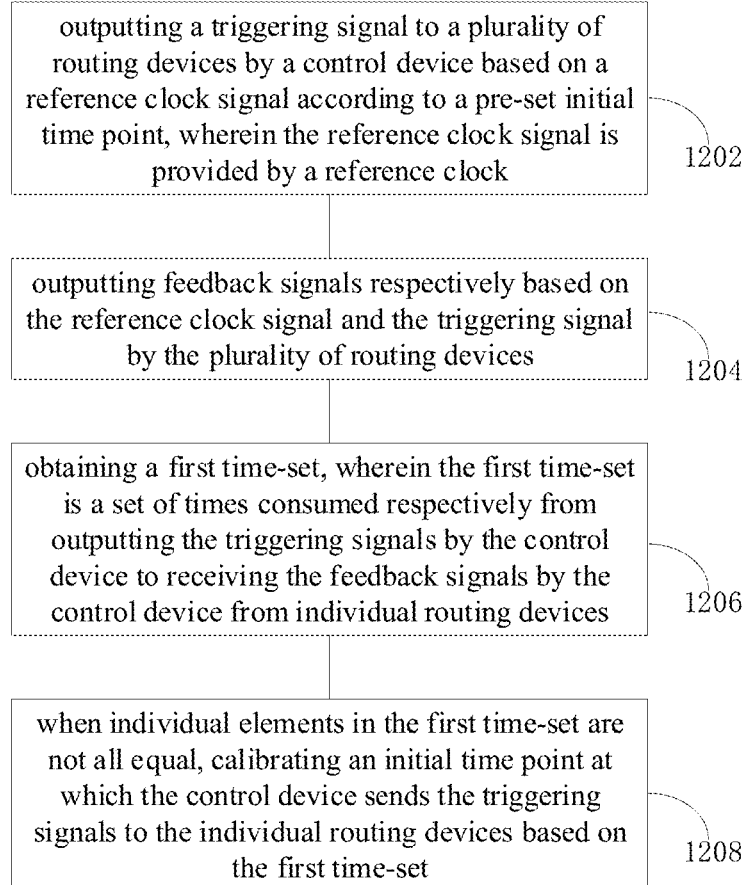
FIG. 5 is a flowchart of a synchronous triggering calibration method of a quantum control system according to an embodiment of the present disclosure.

Please refer to FIG. 5, the embodiment of the present disclosure also proposes a synchronous triggering calibration method for a quantum control system, comprising:

S1202: outputting a triggering signal to a plurality of routing devices by a control device based on a reference clock signal according to a pre-set initial time point, wherein the reference clock signal is provided by a reference clock;

S1204: outputting feedback signals respectively based on the reference clock signal and the triggering signal by the plurality of routing devices;

S1206: obtaining a first time-set, wherein the first time-set is a set of times consumed respectively from outputting the triggering signals by the control device to receiving the feedback signals by the control device from individual routing devices;

S1208: when individual elements in the first time-set are not all equal, calibrating an initial time point at which the control device sends the triggering signals to the individual routing devices based on the first time-set.

The difference from the prior art lies in that in the synchronous triggering calibration method for a quantum control system proposed by the present disclosure, the control device outputs a triggering signal to a plurality of routing devices based on the reference clock signal provided by the reference clock: outputting feedback signals respectively based on the reference clock signal and the triggering signal by the plurality of routing devices, and obtaining a first time-set: when individual elements in the first time-set are not all equal, calibrating an initial time point at which the control device sends the triggering signals to the individual routing devices based on the first time-set. Based on the above calibration methods, it is possible to effectively realize the triggering synchronization of the quantum control system. Besides, by providing the reference clock signal to the control device and routing device with the same reference clock, it is possible to make individual devices in the quantum control system perform related actions in the same timing sequence, which further guarantees the accuracy of the calibration method and reduces the difficulty of triggering synchronization calibration of the quantum control system.

In the present embodiment, the trigger signal is a signal used during the calibration process, but not a signal used in the actual application of the quantum computing. In order to ensure that the calibration accuracy of the synchronous trigger in the quantum control system is sufficiently high, particularly, the frequency of the trigger signal is higher than the frequency of the signal used in the actual application of the quantum computing. For example, if the frequency of the signal used in the actual application of the quantum computing is 1 MHz, then the frequency of the trigger signal may be set to 10 MHz.

All routing boards synchronize their actions based on the reference clock signal provided by the reference clock. If the routing boards return and output the feedback signal immediately upon receiving the trigger signal, it is highly likely to cause a disorder in the clock timing. Since the routing boards operate in a certain timing, it needs to first expend some time to process the received information at the time point of receiving the trigger signal. For example, assuming that the routing boards is set to trigger work on the rising edge of the clock timing, and if the current routing boards receives the trigger signal on the falling edge of the clock timing, and if the signal is directly returned at this moment, then the signals returned to the central control device is bound to be erroneous since the routing boards do not actually receive the trigger signal, which ultimately leads to an imprecise calibration of the synchronous triggering for the quantum control system. The applicant has considered to let all the routing boards wait for a certain clock period after receiving the trigger signal, and then return the feedback signal, so that the above problem may be effectively solved. Based on the above concept, the plurality of routing devices output the feedback signals respectively based on the reference clock signal and the triggering signal, that is, the step S1204 comprises:

the plurality of routing devices receiving the triggering signal and respectively outputting the feedback signals based on the reference clock signal after waiting for a second time.

In the present embodiment, the second time is a clock period of several reference clocks.

Since the precision of synchronous triggering achieved by merely a single calibration process may not meet the demands of quantum computing, in order to improve the precision of synchronous triggering, the applicant has proposed the following scheme, and the synchronous triggering calibration method may further comprise:

S1210: based on a calibrated initial time point, returning to perform said "outputting a triggering signal to a plurality of routing devices by a control device based on a reference clock signal according to a pre-set initial time point" until individual elements in the first time-set are all equal.

The scheme of improving the adjustment of an initial time point at which the control device sends the triggering signals to the individual routing devices by using the first time-set in the step S1208 of the synchronous triggering calibration method of the quantum control system may be selected according to actual needs. In the present embodiment, three preferred schemes are provided for selection, and are preferred implementation schemes. Other schemes may also be chosen in actual application, which are not elaborated one by one here. The following specifically describes these three preferred schemes:

Optionally, said "calibrating an initial time point at which the control device sends the triggering signals to the individual routing devices based on the first time-set" may comprise:

obtaining a third time set based on the first time-set, wherein the third time set is a set of times consumed separately from outputting the triggering signals by the control device to receiving the triggering signals by the individual routing devices:

obtaining the longest time in the third time set as a fourth time:

adjusting the initial time point at which the control device sends the triggering signals to the individual routing devices based on the fourth time.

Specifically, the routing device corresponding to the fourth time is a first routing device: said "adjusting the initial time point at which the control device sends the triggering signals to the individual routing devices based on the fourth time" comprises:

performing a sending-delayed processing on an initial time point at which the control device outputs the triggering signals to all routing devices in the plurality of routing devices except the first routing device such that the triggering signals output by the control device arrive at individual routing devices at the same time point.

Optionally, said "calibrating an initial time point at which the control device sends the triggering signals to the individual routing devices based on the first time-set" may further comprise:

obtaining a third time set based on the first time-set, wherein the third time set is a set of times consumed separately from outputting the triggering signals by the control device to receiving the triggering signals by the individual routing devices:

obtaining the shortest time in the third time set as a fifth time:

adjusting the initial time point at which the control device sends the triggering signals to the individual routing devices based on the fifth time.

Specifically, the routing device corresponding to the fifth time is a second routing device: said "adjusting the initial time point at which the control device sends the triggering signals to the individual routing devices based on the fifth time" comprises:

performing a sending-ahead processing on an initial time point at which the control device outputs the triggering signals to all routing devices in the plurality of routing devices except the second routing device such that the triggering signals output by the control device arrive at individual routing devices at the same time point.

Optionally, said "calibrating an initial time point at which the control device sends the triggering signals to the individual routing devices based on the first time-set" may further comprise:

obtaining a third time set based on the first time-set, wherein the third time set is a set of times consumed separately from outputting the triggering signals by the control device to receiving the triggering signals by the individual routing devices:

obtaining the time corresponding to a selected third routing device in the third time set as a sixth time:

adjusting the initial time point at which the control device sends the triggering signals to the individual routing devices based on the sixth time.

Specifically, said "adjusting the initial time point at which the control device sends the triggering signals to the individual routing devices based on the sixth time" comprises:

performing a sending-delayed processing or a sending-ahead processing on an initial time point at which the control device outputs the triggering signals to all routing devices in the plurality of routing devices except the third routing device such that the triggering signals output by the control device arrive at individual routing devices at the same time point.

In the present embodiment, the individual elements in the third time set are obtained by the following formula:

$$t = T/2;$$

wherein, t is the time consumed from outputting the triggering signals by the control device to receiving the triggering signals by one of the routing devices, and T is determined according to the elements in the first time-set. It should be noted that if the plurality of routing boards receive the trigger signals and all wait for the second time, then T=T1−t2, wherein T1 is an element of the first time-set, and t2 is the second time. If the plurality of routing boards receive the trigger signals and do not need to wait for the second time, then T=T1.

It should be understood by those skilled in the art that, in addition to the three schemes described above, there may also be other similar schemes. The choice of which scheme to use in actual application may be adjusted as needed, which is not restricted herein.

In the actual application to the quantum control system, the control device is generally a center control, which is an intelligent device with data-processing capability, and may be, for example, a FPGA (Field Programmable Gate Array), an MCU (Microcontroller Unit), an MPU (Microprocessor Unit), or a DSP (Digital Signal Processor), and the like. In the present embodiment, the control device is preferably an FPGA. The routing device may generally be routing boards. In order to facilitate the understanding of those skilled in the art, the scheme of the present disclosure is described below with reference to a specific example:

The control device sends trigger signals to each routing device, and it is assumed that this process takes time t. Meanwhile, a rubidium clock with high-precision is used as the reference clock to start timing. After the signal reaches the routing device, each routing device performs the reference action using the rubidium clock with high-precision as the clock source. The routing device waits for an identical time t2 before outputting feedback signals to the control device, and it is assumed that this process takes time t1. After receiving the feedback signal, the control device stops timing, and it is assumed that the total taken time is T1. Since the communication lines for transmitting the trigger signal and transmitting the feedback signal are designed to be strictly equal in length. The same group is connected through a customized double-ended SMA connector. The coaxial cables of a pair of communication lines used for transmitting the trigger signal and used for transmitting the feedback signal are strictly controlled to be of the same length and have the same mounting torque. In this way, the control device may start to calculate the signal delay time of the trigger channel of each routing device after obtaining the timing result, that is, the trigger delay of one-way single channel is t=T1=(T1−t2)/2. After obtaining the delay between each routing device and the control device, it is possible to adjust the delay and advance amount of the initial sending signals of all other paths by using the longest delay of a certain path as a reference, and iterate this process, thereby ultimately achieving that all routing devices on the trigger path receive the trigger signals at the same time point.

Figure 6:
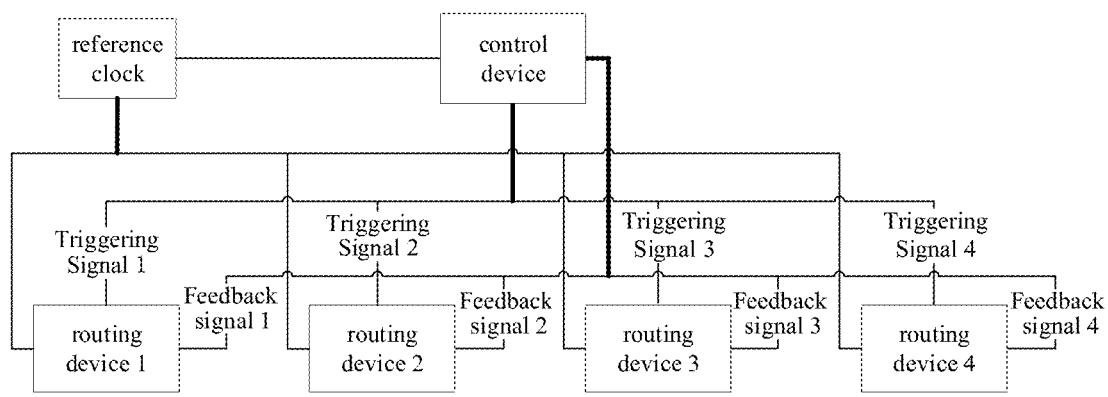
FIG. 6 is a schematic structural illustration of a synchronous triggering system of a quantum control system according to another embodiment of the present disclosure.

Based on the same concept, please refer to FIG. 6, the embodiment of the present disclosure further proposes a synchronous triggering system for the quantum control system, comprising:

a reference clock configured for providing a reference clock signal:

a control device configured for outputting feedback signals respectively based on the reference clock signal and the triggering signal:

the plurality of routing devices configured for outputting feedback signals respectively based on the reference clock signal and the triggering signal:

the control device is further configured for obtaining a first time-set, wherein the first time-set is a set of times consumed respectively from outputting the triggering signals by the control device to receiving the feedback signals by the control device from individual routing devices:

the control device is further configured for when individual elements in the first time-set are not all equal, calibrating an initial time point at which the control device sends the triggering signals to the individual routing devices based on the first time-set.

Specifically, the reference clock may be an atomic clock, which is a highly accurate timekeeper and comes in various types, such as cesium atomic clocks, hydrogen atomic clocks, rubidium atomic clocks, CPT atomic clocks, etc. In the present embodiment, the reference clock 400 is preferably a rubidium atomic clock, and in other embodiments, may also be selected from other types of atomic clocks, which is not restricted herein but is selected based on actual needs. The control device is generally a center control, which is an intelligent device with data-processing capability, and may be, for example, a FPGA (Field Programmable Gate Array), an MCU (Microcontroller Unit), an MPU (Microprocessor Unit), or a DSP (Digital Signal Processor), and the like. In the present embodiment, the control device is preferably an FPGA, and the routing device may generally be routing boards.

Based on the same concept, the embodiment of the present disclosure further proposes a quantum control system, which utilizes the synchronous triggering calibration method for the quantum control system as described in any of the above feature descriptions, or the synchronous triggering system for the quantum control system as described in any of the above feature descriptions.

Based on the same concept, the embodiment of the present disclosure further proposes a readable storage medium where a computer program is stored, and the computer program, when executed by a processor, can implement the synchronous triggering calibration method for the quantum control system as described in any of the above feature descriptions.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the readable storage medium comprises the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, comprising an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, comprising a local area network (LAN) or a wide area network (WAN), or the connection may be made to an external computer (for example, through the Internet using an Internet Service Provider). In some embodiments, electronic circuitry comprising, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, systems, and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture comprising instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s).

In the description of this specification, reference to the terms "an embodiment", "some embodiments", "examples", or "specific examples", etc. means that the specific features, structures, materials, or characteristics described in conjunction with the embodiment or example are comprised in at least one embodiment or example of the present disclosure. In this specification, schematic expressions of the above terms are not necessarily directed to the same embodiment or example. Also, the particular features, structures, materials, or characteristics described may be combined in any suitable manner in any one or more embodiments. In addition, various embodiments or examples described in this specification may be incorporated and combined by those skilled in the art.

The foregoing are merely preferred embodiments of the present disclosure and are not intended to be limiting of the present disclosure. Any form of equivalent substitution or modification to the technical solution and technical content disclosed in the present disclosure made by those skilled in the art without departing from the scope of the technical solution of the present disclosure shall fall within the scope of protection of the present disclosure without departing from the scope of the technical solution of the present disclosure.

The invention claimed is:

1. A synchronous triggering system for a quantum control system, characterized by comprising:
a central control device;
a plurality of routing boards; and
a plurality of functional boards, wherein
the central control device is connected to the plurality of routing boards, configured for providing one or more sets of triggering signals to corresponding routing boards, and adjusting an initial time point for each set of triggering signals to output so that each of a plurality of chassis receives the triggering signals concurrently, and wherein each of the routing boards and the plurality of functional boards are provided inside one of the plurality of chassis;

each of the plurality of routing boards is connected to the plurality of functional boards, wherein communication lines from each routing board connected to the functional boards are of equal length, and the routing boards are configured for forwarding the triggering signals to the functional boards; and each of the plurality of functional boards has an AND-gate chip and several data-processing devices, wherein the triggering signals arrive at the one or more data-processing devices simultaneously after being processed under an AND-operation of the AND-gate chip, so as to trigger the data-processing devices synchronously.

2. The system of claim 1, wherein the synchronous triggering system further comprises:

a reference clock configured for providing a reference clock signal for the central control device and the routing boards.

3. The system of claim 2, wherein the reference clock is further configured for providing a reference clock signal for the functional boards.

4. The system of claim 2, wherein there are provided at least two central control devices, and the at least two central control devices work based on a reference clock signal of the same reference clock.

5. The system of claim 1, wherein the routing boards are configured for outputting feedback signals to the central control device based on the triggering signals;

the central control device is further configured for obtaining a first time-set, wherein the first time-set is a set of times consumed respectively from outputting the triggering signals by the central control device to receiving the feedback signals by the central control device from individual routing boards;

the central control device is further configured for when individual elements in the first time-set are not all equal, calibrating an initial time point at which the central control device sends the triggering signals to the individual routing boards based on the first time-set.

6. The system of claim 1, wherein the routing board is provided in the middle of the chassis, and the plurality of functional boards are provided on both sides of the routing board.

7. The system of claim 1, wherein the functional board further comprises a board body, wherein the AND-gate chip and the one or more data-processing devices are provided on the board body;

the functional devices comprise an ADC or a DAC; and the data-processing devices comprise an FPGA or an MCU or an MPU or a DSP.

8. The system of claim 7, wherein the AND-gate chip has one or more input terminals for receiving triggering signals, an output terminal of the AND-gate chip is in communication connection with an input terminal of the one or more data-processing devices, and the AND-gate chip is configured for enabling the triggering signals to arrive at the one or more data-processing devices simultaneously.

9. The system of claim 7, wherein the one or more data-processing devices are provided on the board body at intervals.

10. The system of claim 7, wherein each of the data-processing devices is in communication connection to the plurality of functional devices, and the functional devices are configured for executing, according to instructions of the data-processing devices, corresponding actions.

11. The system of claim 10, wherein the plurality of functional devices are provided on the board body.

12. The system of claim 7, wherein the functional board further comprises a communication interface which is provided on the board body and is connected to the data-processing devices.

13. The system of claim 7, wherein the board body comprises a PCB, on which the data-processing devices, the AND-gate chip and the functional devices are provided.

14. The system of claim 13, wherein the AND-gate chip is connected to the functional devices through wiring in a top signal layer of the PCB.

15. The system of claim 13, wherein the AND-gate chip is connected to the data-processing devices through wiring in a top signal layer of the PCB.

16. The system of claim 13, wherein the data-processing devices are equal in number to input terminals of the AND-gate chip.

17. The system of claim 13, wherein each of the data-processing devices is connected to the plurality of functional devices.

18. The system of claim 7, wherein the AND-gate chip is provided between two adjacent data-processing devices on the board body.

19. A quantum control system using the synchronous triggering system of claim 1.

20. A quantum computer, comprising the quantum control system of claim 19.

* * * * *